(12) United States Patent
Nishimoto et al.

(10) Patent No.: US 8,969,208 B2
(45) Date of Patent: Mar. 3, 2015

(54) METHOD TO FORM CONVEX STRUCTURE ON SURFACE OF SEMICONDUCTOR MATERIAL

(71) Applicant: Sumitomo Electric Device Innovations, Inc., Yokohama-shi, Kanagawa (JP)

(72) Inventors: Yoshifumi Nishimoto, Yokohama (JP); Ryuji Yamabi, Kanagawa (JP)

(73) Assignee: Sumitomo Electric Device Innovations, Inc., Yokohama-shi (JP)

( * ) Notice: Subject to any disclaimer, the term of this patent is extended or adjusted under 35 U.S.C. 154(b) by 0 days.

(21) Appl. No.: 13/853,679

(22) Filed: Mar. 29, 2013

(65) Prior Publication Data

US 2013/0260565 A1   Oct. 3, 2013

(30) Foreign Application Priority Data

Mar. 30, 2012   (JP) ................. 2012-080481

(51) Int. Cl.
*H01L 21/311*   (2006.01)
*H01L 31/0232*   (2014.01)
*H01L 31/105*   (2006.01)
*G02B 3/00*   (2006.01)
*G03F 7/00*   (2006.01)

(52) U.S. Cl.
CPC ........ *H01L 31/02327* (2013.01); *H01L 31/105* (2013.01); *G02B 3/0018* (2013.01); *G03F 7/0005* (2013.01)
USPC .......................................... 438/703; 257/432

(58) Field of Classification Search
CPC ............ H01L 25/167; H01L 27/14625; H01L 27/14627; H01L 27/1462; H01L 27/146; H01L 27/14605; H01L 27/14643; H01L 27/3227; H01L 31/02327; H01L 31/0232; H01L 2224/03618; H01L 2224/03622
USPC ............ 438/65, 68, 69, 70, 703; 257/98, 294, 257/432, 440, E33.068, E33.073, E27.13, 257/E27.133, E27.134, 232–234
See application file for complete search history.

(56) References Cited

U.S. PATENT DOCUMENTS

| | | | |
|---|---|---|---|
| 2002/0058350 A1* | 5/2002 | Kim ............................. | 438/29 |
| 2009/0206435 A1* | 8/2009 | Fukuyoshi et al. ........... | 257/432 |
| 2010/0108865 A1* | 5/2010 | Cho et al. ...................... | 250/216 |

FOREIGN PATENT DOCUMENTS

| | | |
|---|---|---|
| JP | 06-104480 A | 4/1994 |
| JP | 09-326511 A | 12/1997 |

* cited by examiner

*Primary Examiner* — Brook Kebede
(74) *Attorney, Agent, or Firm* — Westerman, Hattori, Daniels & Adrian, LLP

(57) ABSTRACT

A process to form a lens on a semiconductor material is disclosed. The process includes steps of: forming double layers of an intermediate layer on the semiconductor material and a mask layer made of hard-baked photoresist on the semiconductor substrate; the first transcribing the convex shape of the mask layer on the intermediate layer; and the second scribing the convex shape of the intermediate layer on the semiconductor material.

6 Claims, 4 Drawing Sheets

METHOD TO FORM CONVEX STRUCTURE ON SURFACE OF SEMICONDUCTOR MATERIAL

CROSS-REFERENCE TO RELATED APPLICATION

This application is based upon and claims the benefit of priority of the prior Japanese Patent Application No. 2012-080481, filed on Mar. 30, 2012, the entire contents of which are incorporated herein by reference.

BACKGROUND OF THE INVENTION (i) Technical Field

The present invention relates to a process to form a specific structure such as optical lens on a surface of a semiconductor material, or on the surface of a semiconductor substrate.

(ii) Related Background Arts

Several background arts relating to a process to form a monolithic lens on a surface of the semiconductor material have been reported. However, such background arts have directly transcribed a photoresist pattern with a hemispherical or convex shape on the semiconductor material. In such conventional processes, the convex pattern of the photoresist is hard to be transcribed on the semiconductor material when the surface of photoresist is damaged by, for instance, radio frequency (RF) plasma during the plasma process.

SUMMARY OF THE INVENTION

A method according to an embodiment of the invention relates to form a lens on a surface of a semiconductor material monolithically. The method includes steps of: forming an intermediate layer on a surface of the semiconductor material; forming a mask layer with a convex shape of the intermediate layer; first transcribing the convex shape of the mask layer on the intermediate layer to from a processed intermediate layer with a semispherical shape by etching the mask layer and the intermediate layer to expose the semiconductor material; and second transcribing the semispherical shape of the processed intermediate layer on the semiconductor material to form the monolithic lens.

A feature of the method is that the convex shape of the mask layer, the convex shape of the processed intermediate layer and the lens may have curvatures different from others. That is, the first transcription of the convex shape of the mask layer to the convex shape of the processed intermediate layer is carried out by dry-etching; and the second transcription of the convex shape of the processed intermediate layer to the convex shape of the lens is also carried out by dry-etching. Selecting etching conditions, such as gas sources, pressures, temperatures, powers, and so on, the curvature of the convex shape of the processed intermediate layer and that of the lens may be optionally selected.

The etching rate of the intermediate layer during the first transcription is preferably less than that of the mask layer, which becomes the curvature of the convex shape of the processed intermediate layer larger than that of the convex shape of the mask layer; while, the etching rate of the processed intermediate layer during the second transcription is preferably less than that of the semiconductor material, which becomes the curvature of the lens smaller than that of the convex shape of the processed intermediate layer. Thus, the curvature of the monolithic lens is optionally set even when the mask layer, which is made of hard baked photoresist, is limited in the convex shape thereof, in particular, the curvature of the convex shape due to the process conditions.

BRIEF DESCRIPTION OF THE DRAWINGS

The foregoing and other purposes, aspects and advantages will be better understood from the following detailed description of a preferred embodiment of the invention with reference to the drawings, in which.

DESCRIPTION OF PREFERRED EMBODIMENTS

Next, some preferred embodiments according to the present invention will be described as referring to drawings.

First Embodiment

Figure 1A:
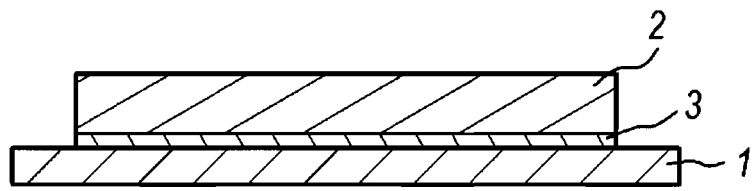
FIGS. 1A to 1E show processes in a first half thereof to form a lens on the semiconductor surface.

The first embodiment of the present invention will be described as referring to FIGS. 1 and 2, where the first embodiment relates to a process to form a lens on a surface of a semiconductor material. As shown in FIG. 1A, the semiconductor material 2 to be processed is fixed on a support 1. Specifically, coating the support 1 with a wax 3, placing the semiconductor material 2 on the wax 3, and hardening the wax 3, the semiconductor material 2 is fixed to the support 1. The support 1 is made of, for instance, silica glass; while, the semiconductor material 2 is made of typically InP substrate. Polishing a surface opposite to that facing the support 1, the semiconductor material 2 may have an optionally adjusted thickness. A typical thickness of the semiconductor material 2 is around 100 µm.

Figure 1B:
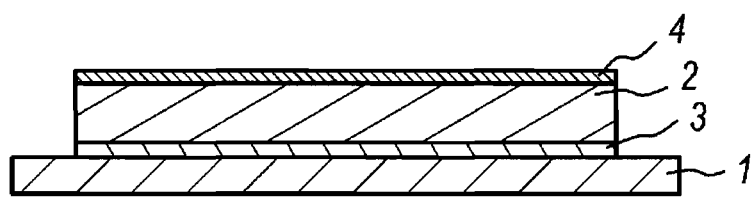
Figure 1C:
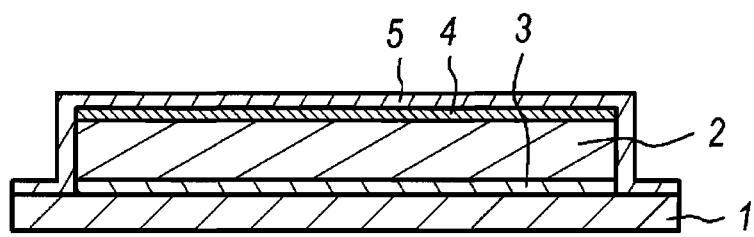
Figure 1D:
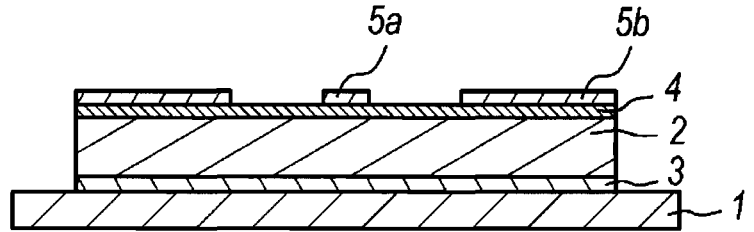

Subsequent to FIG. 1A, the process of the present embodiment forms an intermediate layer 4 on the semiconductor material 2, as shown in FIG. 1B. The intermediate layer 4 is made of material containing silicon (Si). For instance, the intermediate layer 4 is made of silicon oxide ($SiO_2$), silicon nitride (SiN), or silicon oxy-nitride (SiON). The present embodiment provides the intermediate layer 3 made of $SiO_2$ with a thickness of about 300 nm deposited by sputtering. Next, a photoresist 5 is coated on the intermediate layer 4 with thickness of about 2 µm by a conventional lithography process for semiconductor wafers, typically a spin-coater, as shown in FIG. 1C. The photoresist 5 of the present embodiment is a positive type and primarily contains novolak resin. The coated photoresist 5 is prebaked before the exposure.

Exposing and developing the photoresist 5, a patterned resists, 5a and 5b, are left on the intermediate layer 3. The former pattern 5a has a circular shape with a diameter of about 50 µm and is left in a region where a lens is to be formed. While, the latter pattern 5b surrounds the former pattern 5a with a gap to expose the surface of the intermediate layer 4.

Figure 1E:
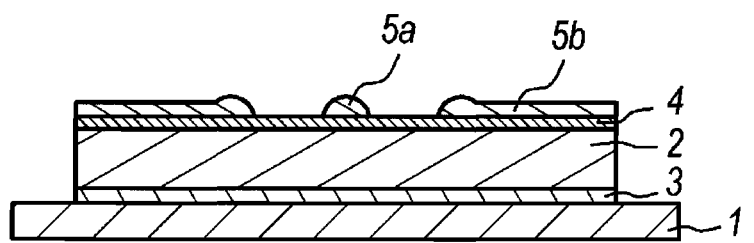

Hard baking the patterned resists, 5a and 5b, by raising a temperature thereof to 200° C. for 5 minutes, the patterned photoresists, 5a and 5b, are deformed. In particular, the patterned photoresist 5a with a circular plane shape deforms to have a hemispherical or convex shape by surface tension thereof, as shown in FIG. 1E.

Then, transcribing the photoresists, 5a and 5b, to the intermediate layer 4; processed intermediate layers, 4a and 4b, each transcribed from respective patterned photoresists, 5a and 5b, are left on the semiconductor material 2. The transcription is carried out to expose the semiconductor material 2 between two photoresist patterns, 5a and 5b, by removing the intermediate layer 4. The patterned photoresists, 5a and 5b, on the intermediate layer 4 are fully removed by the transcribing process. In other words, the transcription of the patterned photoresists, 5a and 5b, on the intermediate layer 4 is carried out until the semiconductor material 2 is exposed between the patterned photoresists, 5a and 5b.

The process to transcribe the photoresist patterns, 5a and 5b, on the intermediate layer 4 is carried out by, for instance, inductively coupled plasma reactive ion etching (ICP-RIE) using reactive gases primarily including fluorine (F) and oxygen (O). The embodiments shown in FIG. 2A uses a mixture of carbon fluoride ($CF_4$) and oxygen ($O_2$), whose flow rates were 50 sccm and 100 sccm, respectively, and a pressure of 1 Pa; and RF power of 400 W for the ICP output and a bias of 100 W. The intermediate layer 4 and the photoresist 5 are concurrently etched by the mixture of carbon fluoride and oxygen as the reactive gases. Etching rate for the intermediate layer 4 and that for the photoresist 5 are optionally variable by changing the flow rates or the partial pressure of respective gases. The $CF_4$ primarily etches the intermediate layer 4 containing silicon (Si), while, the oxygen primarily etches the photoresists, 5a and 5b. Note that the etching of the patterned photoresists, 5a and 5b, and that of the intermediate layer 4 proceeds accompanied with substantially no side etching. Accordingly, the convex shape of the patterned photoresists, 5a and 5b, are transcribed on the intermediate layer 4.

Figure 2A:
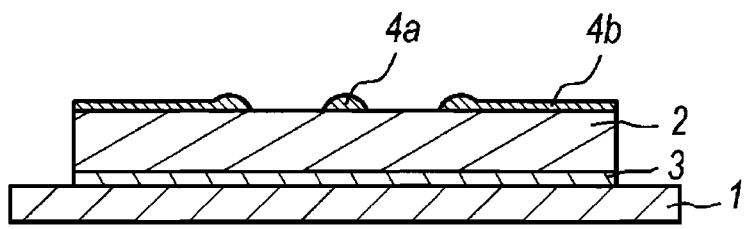
FIGS. 2A to 2E show processes in a last half thereof to form the lens on the semiconductor surface.
Figure 2B:
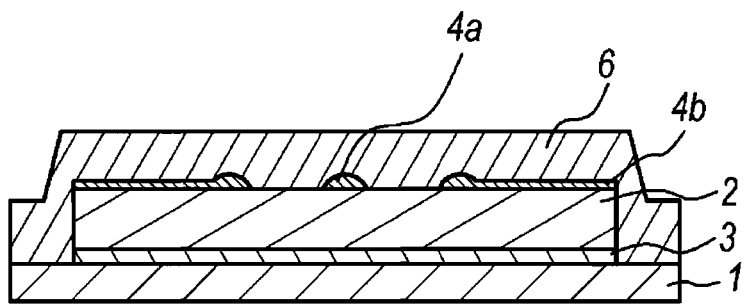
Figure 2C:
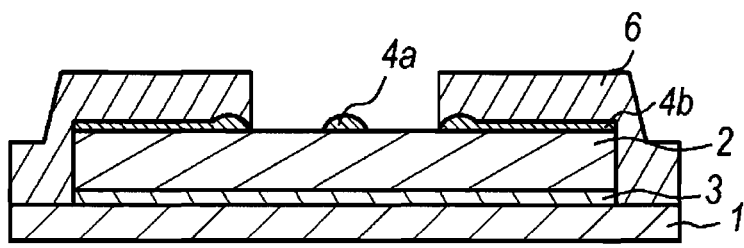
Figure 2D:
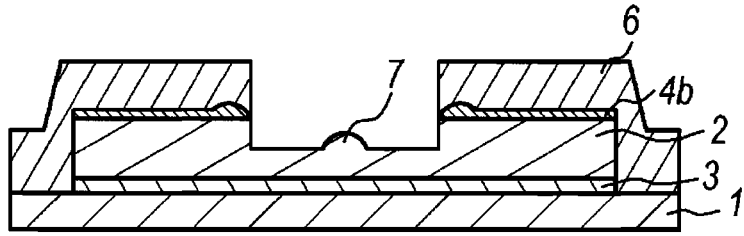
Figure 2E:
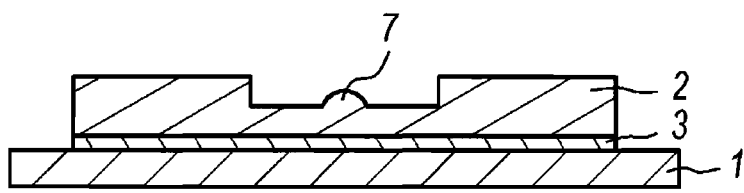

Then, the process fully covers the processed intermediate layer 4 and the exposed semiconductor material 2 by another photoresist 6, as shown in FIG. 2B. The second photoresist 6 is subsequently processed by a conventional photolithography technique to expose the surface of the semiconductor material 2 between two processed intermediate layers, 4a and 4b, which is shown in FIG. 2C.

Next, the process transcribes the shape of the processed intermediate layer 4a on the semiconductor material 2 to form a monolithic lens thereon. The transcription is also carried out by ICP-RIE using halogen, for instance, hydrogen iodide (HI), chlorine ($Cl_2$), and so on as a reactive gas source. The present embodiment uses a mixture of HI with a flow rate of 40 sccm, helium (He) with a flow rate of 40 sccm, and tetrachloro-silane ($SiCl_4$) with a flow rate of 10 sccm to be a pressure in a reactive chamber of 1 Pa; and the RF power of 400 W with a bias of 100 W. The halogen gas selectively etches the semiconductor material 2 and the intermediate layer 4 exposed by the second resist 6. The selective etching optionally adjusts the height of the lens 7. For example, the lens 7 has a height less than a depth of a region of the semiconductor material 2 covered with the photoresist 6.

In this process, the processed intermediate layer 4a is fully removed by the ICP-RIE because the etching conditions descried above shows an etching rate of the intermediate layer substantially equal to or less than that of the semiconductor material 2, but far greater than that of the photoresist 6. Moreover, the etching by the ICP-RIE performs inhomogeneity, that is, the etching advances substantially only in the vertical direction, and causes no side etching. Accordingly, the convex shape of the processed intermediate layer 4a is transcribed on the surface of the semiconductor material 2 as a convex lens.

Removing the photoresist 6 and the processed intermediate layer 4b covered by the photoresist 6, the semiconductor material 2 with the monolithic lens 7 in a hollow of the surface thereof is obtained. The removal of the photoresist 6 and the processed intermediate layer 4b is carried out by, for instance, a resist remover and a buffered fluoric acid, respectively.

The present embodiment provides two transcribing steps. That is, the convex shape of the hard baked photoresist 5 is first transcribed on the intermediate layer to form a convex shape thereof, and this convex shape of the processed intermediate layer 4a is subsequently transcribed on the surface of the semiconductor material 2.

The two step formation of the monolithic lens 7 done by RIE is escaped from, compared with a process using ion milling, not only the surface degradation of the photoresist but the heating thereof, which enables to fix the semiconductor material 2 to a glass support. A glass often shows an inferior performance from a viewpoint of heat dissipation. Moreover, the glass support, which is usually transparent for light utilized in the exposure of the photoresist, facilitates the alignment of the photo mask with patterns to be transcribed on the surface of the semiconductor material 2. Also, the transparent glass mask is unnecessary to be replaced to another support for respective process steps.

The ICP-RIE optionally adjusts the etching rates of the photoresists, 5 and 6, the intermediate layer 4, and the semiconductor material 2. For instance, the etching rate of the intermediate layer 4 is substantially equal to or less than that of the first photoresist 5 but far greater than that of the semiconductor material in the first transcription; while, the etching rate of the intermediate layer 4 is substantially equal to or less than that of the semiconductor material 2 but far greater than that of the second photoresist 6 in the second transcription. That is, the etching rate of substances in the $1^{st}$ and $2^{nd}$ transcription satisfies the following:

$$\text{photoresist}{\sim}{>}\text{intermediate layer}{>>}\text{semiconductor region}, \quad (1)$$

and $$\text{photoresist}{<<}\text{intermediate layer}{<}{\sim}\text{semiconductor region}. \quad (2)$$

In the equations above, a symbol "~>" means that a parameter put in left of this symbol is substantially equal to, or greater than, a parameter put in right of the symbol, while the other symbol "<~" means that a parameter put in left is substantially equal to, or less than, a parameter put in right.

Choosing material of the intermediate layer 4 and setting the etching conditions satisfying the above equations, the convex shape of the hard baked photoresist, even when the curvature thereof is formed in small, is easily transcribed on the intermediate layer 4 with a curvature greater than the curvature of the photoresist 5.

Moreover, setting the etching condition described above for the second transcription, the convex shape of the intermediate layer 4, even when the curvature thereof is formed greater in the first transcription, is easily transcribed on the lens 7 in the semiconductor material 2 with a smaller curvature. Thus, according to the present process, the monolithic lens 7 whose curvature is optionally selected is able to be obtained even when the process begins with the hard baked photoresist 5 whose curvature is limited by the process conditions.

For instance, setting the condition for the first transcription to be greater etching rate for the photoresist 5 compared with that of the intermediate layer 4, and the condition for the second transcription to be greater etching rate for the semiconductor material 2 compared with the intermediate layer 4, the convex shape of the patterned photoresist 5a is transcribed on the convex shape of the lens 7 without difficulty. The first transcription preferably sets the etching rate of the patterned photoresist 5a at least twice as large as that of the intermediate layer 4, and the second transcription preferable sets the etching rate of the processed intermediate layer 4a as half as that of the semiconductor material 2 at most.

For instance, setting the selectivity A of the intermediate layer 4 against the patterned photoresist 5 to be 1/10, while, the selectivity B of the semiconductor material 2 against the processed intermediate layer 4a to be 10; then, the selectivity of the patterned photoresist 5 against the semiconductor material 2 becomes unity (1/10×10=1). Thus, by setting the intermediate layer 4 and the etching condition in the first transcription such that the etching rate thereof is less than that of the patterned photoresist 5a, the convex shape of the processed intermediate layer 4a may have a larger curvature even when the patterned photoresist 5a shows a convex shape with a smaller curvature.

Also, by setting the etching condition in the second transcription such that the etching rate of the processed intermediate layer 4a is less than that of the semiconductor material 2, the convex shape formed in the semiconductor material 2 may have a smaller curvature even when the processed intermediate layer 4a has a convex shape with a larger curvature. That is, even when the patterned photoresist 5a is limited in physical parameters in a convex shape or a convex shape due to the formation process thereof, namely, softening by the hard baking accompanied to induce the surface tension thereof; the monolithic lens on the surface of the semiconductor material 2 has optical dimensions, in particular, the curvature of the convex shape thereof.

Second Embodiment

Figure 3:
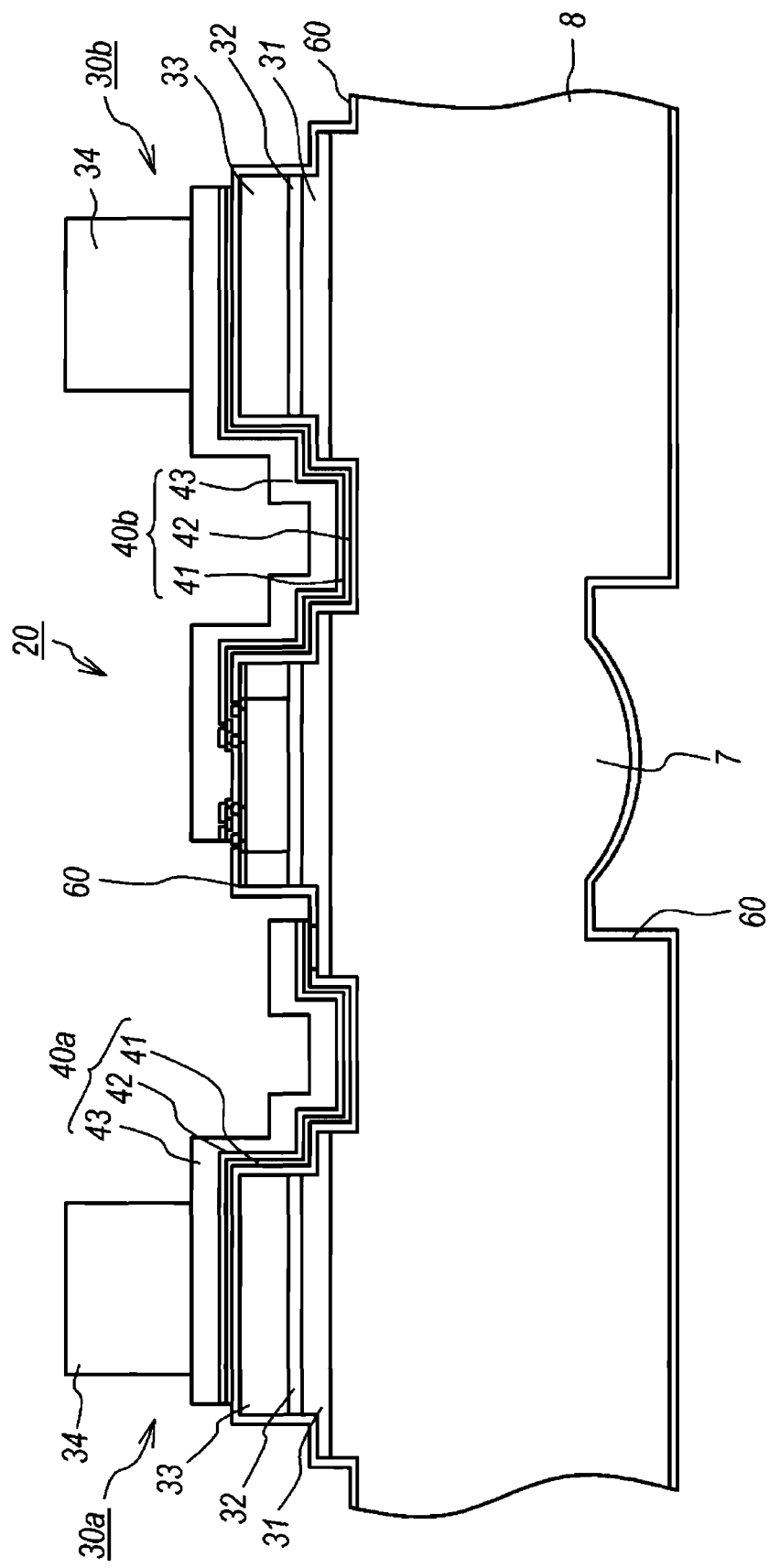
FIG. 3 shows a cross section of a photo detector implementing with a monolithic lens formed by the process shown in FIGS. 1A to 2E.

Next, another embodiment according to the present invention will be described as referring to FIGS. 3 and 4. The second embodiment includes steps of forming a semiconductor device on a primary surface of a semiconductor substrate, while, a lens on a back surface thereof monolithically. FIG. 3 shows a cross section of a semiconductor photo detector 100 with a semiconductor active device on the primary surface of the substrate 8, and FIG. 4 magnifies the semiconductor active device 20. Although the description below concentrates on a light-receiving device containing a photo detector as an optically active device, a light-transmitting device containing a semiconductor laser diode, typically, a vertical cavity surface emitting layer diode (VCSEL), is also applicable for the present invention.

Figure 4:
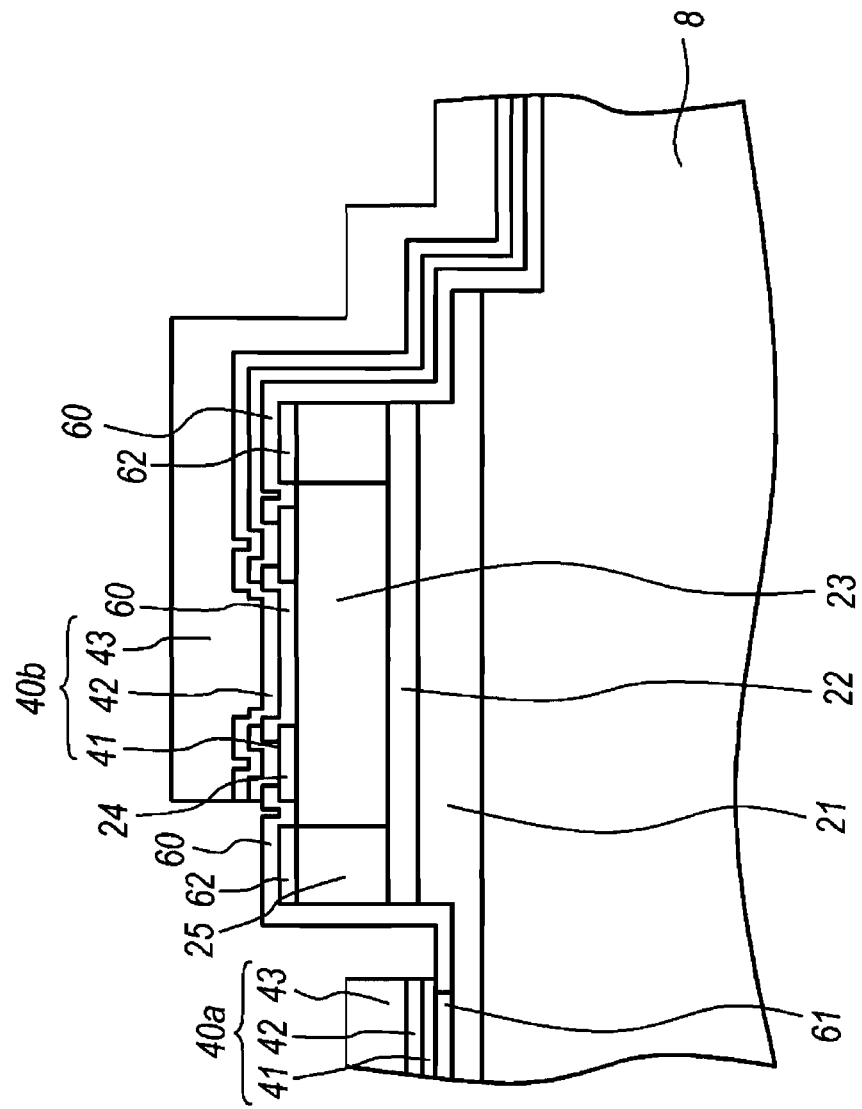
FIG. 4 magnifies a portion of a semiconductor active device contained in the photo diode shown in FIG. 3.

As shown in FIGS. 3 and 4, the semiconductor active device 20 includes a stack of an n-type layer 2, an i-type layer 22, a p-type layer 23, and a contact layer 24 on the semiconductor substrate 8. The n-type layer 21, the i-type layer 22, and the p-type layer are made of n-type InP, an i-type InGaAs, and a p-type InP, respectively. However, the combination of the layers in the stack is not restricted to those described above. Other combinations are applicable to the semiconductor active device 20 depending on, for instance, a wavelength of light to be detected.

The p-type layer 23 has a diameter less than a diameter of the i-type layer 22. Disposed on the i-type layer 22 and sides of the p-type layer 23 is an n-type layer 25 made of, for instance, n-type InP. The semiconductor substrate 8 is made of semi-insulating material with resistivity of 2.2 to $6.6 \times 10^7$ Ωcm. One typical example is that the semiconductor substrate is made of semi-insulating InP. The contact layer 24 is made of, for instance, p-type InGaAs.

The semiconductor active device 20 is laterally aligned with a lens 7, or, or the lens 7 is laterally, in the back surface of the semiconductor substrate 8, aligned with the semiconductor active device 20 to concentrate light entering the semiconductor substrate 8 from the back surface thereof on the semiconductor active device 20. When a top of the lens 7 is in a level thereof lower than the back surface of the semiconductor substrate 8, the lens 7 is escaped from scratches, chipping, cracking, and so on because the top of the lens 7 is drawn back from the back surface of the semiconductor substrate 8.

Two mesas, 30a and 30b, each have a stack including on the semiconductor substrate 8 an n-type layer 31, an i-type layer 32, and an n-type layer 33. The lower n-type layer 31 is made of n-type InP, the i-type layer 32 is made of i-type InGaAs, and the upper n-type layer 33 is made of n-type InP.

The insulating layer 60 is made of silicon nitride (SiN) and covers the surface of the semiconductor active device 20, two mesas, 30a and 30b, the top surface of the semiconductor substrate 8, and the back surface of the semiconductor substrate 8. Referring to FIG. 4, a mask layer 62 is disposed between the n-type layer 25 and the insulating layer 60. The mask layer 62 is made of also silicon nitride (SiN). Interconnections, 40a and 40b, having a stack comprised of, from the side of the semiconductor substrate 8, a double layer of titanium and platinum (Ti/Pt) 41, a sputtered gold (Au) 42, and a plated gold (Au) 43, are provided on the insulating layer 60 to isolate the interconnections, 40a and 40b, the semiconductor active device 20, and two mesas, 30a and 30b, electrically from the semiconductor substrate 8. The interconnections, 40a and 40b, on respective mesas, 30a and 30b, provide an electrical pad 34.

The insulating layer 60 has an opening on the contact layer 24 to make the contact layer 24 electrically in contact with the interconnection 40a. The insulating layer 60 provides another opening on the n-type layer 21 where anther contact layer 61 is formed therein to make the n-type layer 21 electrically in contact with the other interconnection 40b. The contact layer 61 is made of a stack including eutectic metal of AuGe and gold (AuGe/Au). The insulating layer 60 covers not only sides of respective mesas, 30a and 30b, but the surface of the semiconductor substrate 8 exposed between the mesas, 30a and 30b, and the semiconductor active device 20.

The first embodiment processes the semiconductor material provided on the support. However, the present invention is not restricted to those arrangements. For instance, the second embodiment process the back surface of the semiconductor substrate to form the lens aligned with the semiconductor active device formed on the top surface of the semiconductor substrate 8. Two embodiments provide the semiconductor material, or the semiconductor substrate made of InP. Other semiconductor materials or substrate are appreciable to the present invention; for instance, silicon (Si), gallium arsenide (GaAs), and the like are applicable as the semiconductor material, or the substrate of the invention. The second embodiment processes the lens monolithically formed with the semiconductor active device. However, the lens is formed independent of the semiconductor active device 20. Also, the second embodiment has the arrangement of the back-illuminated photodiode. However, the present invention is used for the front-illuminated photodiode. The semiconductor active device 20 is a photodiode in the second embodiment; however, the invention may be also used in the light-transmitting device.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A method to form a lens on a semiconductor material monolithically, comprising steps of:
    forming an intermediate layer on a surface of the semiconductor material made of InP, the intermediate layer being made of silicon oxide, silicon nitride or silicon oxynitride;
    forming a mask layer on the intermediate layer, the mask layer having a first photoresist having a circular shape and a second photoresist that is spaced from the first photoresist and surrounds the first photoresist;
    deforming the first photoresist to have a hemispherical or convex shape by thermal treatment;
    transcribing the shape of the mask layer on the intermediate layer to form a processed intermediate layer by etching the mask layer and the intermediate layer to expose the surface of the semiconductor material, the processed intermediate layer having a first processed intermediate layer having a circular shape and a second processed intermediate layer that is spaced from the first processed intermediate layer and surrounds the first processed intermediate layer;
    forming a third photoresist so as to cover the first processed intermediate layer and the second processed intermediate layer;
    removing a region of the third photoresist on the first processed intermediate layer and leaving another region of the third photoresist on the second processed intermediate layer; and
    transcribing the shape of the first processed intermediate layer on the surface of the semiconductor material to form the lens in the semiconductor material.

2. The method of claim 1,
    wherein the shape of the first processed intermediate layer has a curvature greater than a curvature of the shape of the first photoresist.

3. The method of claim 2,
    wherein the lens has a curvature less than the curvature of the first processed intermediate layer.

4. The method of claim 1,
    wherein the step of transcribing the mask layer on the intermediate layer is carried out by first dry-etching using a gas containing fluorine and oxygen, and
    wherein the step of transcribing the processed intermediate layer on the semiconductor material is carried out by second dry-etching using another gas containing fluorine and halogen.

5. The method of claim 4,
    wherein the intermediate layer has an etching rate less than an etching rate of the mask layer in the first dry-etching, and
    wherein the intermediate layer has an etching rate less than an etching rate of the semiconductor material in the second dry-etching.

6. The method of claim 1,
    further including a step, before the formation of the intermediate layer, fixing the semiconductor material on a support made of silica glass.

* * * * *